(12) United States Patent
Adolf et al.

(10) Patent No.: US 11,106,841 B1
(45) Date of Patent: Aug. 31, 2021

(54) PHYSICAL DEVICE OPTIMIZATION WITH REDUCED MEMORY FOOTPRINT VIA TIME REVERSAL AT ABSORBING BOUNDARIES

(71) Applicant: X Development LLC, Mountain View, CA (US)

(72) Inventors: Brian Adolf, San Mateo, CA (US); Martin Schubert, Mountain View, CA (US); Jesse Lu, Hollister, CA (US)

(73) Assignee: X Development LLC, Mountain View, CA (US)

( * ) Notice: Subject to any disclaimer, the term of this patent is extended or adjusted under 35 U.S.C. 154(b) by 315 days.

(21) Appl. No.: 16/397,395

(22) Filed: Apr. 29, 2019

(51) Int. Cl.
*G06F 30/20* (2020.01)
*G06F 30/17* (2020.01)
*G06T 17/00* (2006.01)

(52) U.S. Cl.
CPC .............. *G06F 30/20* (2020.01); *G06F 30/17* (2020.01); *G06T 17/00* (2013.01)

(58) Field of Classification Search
CPC ...... G06F 30/20; G06F 30/17; G06F 2111/10; G06T 17/00
See application file for complete search history.

(56) References Cited

U.S. PATENT DOCUMENTS

| 5,774,693 A | 6/1998 | Hsu et al. | |
|---|---|---|---|
| 6,687,659 B1 * | 2/2004 | Shen | G01V 1/28 367/73 |

(Continued)

FOREIGN PATENT DOCUMENTS

| EP | 2838084 A1 * | 2/2015 | ............. G06F 30/23 |
|---|---|---|---|
| WO | 2017/176370 A1 | 10/2017 | |
| WO | 2017/223560 A1 | 12/2017 | |

OTHER PUBLICATIONS

Petykiewicz. "Active Nanophotonics: Inverse Design and Strained Germaniui'v1 Light Emitters". http://purl.stanford.edu/bh310ks0536. Oct. 2016. 134 Pages. (Year: 2016).*

(Continued)

*Primary Examiner* — Eunhee Kim
(74) *Attorney, Agent, or Firm* — Christensen O'Connor Johnson Kindness PLLC

(57) ABSTRACT

A system, apparatus, and method for optimizing structural parameters of a physical device are described. The method includes receiving an initial description of the physical device describing the structural parameters within a simulated environment. The method further includes performing a simulation of the physical device in response to an excitation source to determine a performance metric of the physical device. The simulation environment includes one or more absorbing boundaries for attenuation of an output of the excitation source during the simulation. The method further includes recording attenuated field values of the simulated environment associated with the attenuation during the simulation. The method further includes determining a loss metric based on a difference between the performance metric and a target performance metric, backpropagating the loss metric using the attenuated field values, and generating a revised description of the physical device by updating the structural parameters to reduce the loss metric.

24 Claims, 7 Drawing Sheets

(56) References Cited

U.S. PATENT DOCUMENTS

| | | | |
|---|---|---|---|
| 6,772,076 B2 | 8/2004 | Yamamoto et al. | |
| 6,804,446 B1* | 10/2004 | Nordin | B82Y 20/00 385/125 |
| 9,589,757 B1 | 3/2017 | Hannon et al. | |
| 2004/0225483 A1 | 11/2004 | Okoniewski et al. | |
| 2010/0312539 A1 | 12/2010 | Yamagajo et al. | |
| 2012/0010862 A1* | 1/2012 | Costen | G06F 30/23 703/2 |
| 2014/0365188 A1 | 12/2014 | Doerr | |
| 2014/0372043 A1 | 12/2014 | Hu et al. | |
| 2016/0012176 A1 | 1/2016 | Liu et al. | |
| 2016/0033765 A1 | 2/2016 | Liu et al. | |
| 2016/0174902 A1 | 6/2016 | Georgescu et al. | |
| 2018/0018757 A1 | 1/2018 | Suzuki | |
| 2018/0045953 A1* | 2/2018 | Fan | G02B 5/18 |
| 2019/0279094 A1* | 9/2019 | Baughman | G06N 3/10 |

OTHER PUBLICATIONS

Chen, R.T. et al., "Neural Ordinary Differential Equations", 32nd Conference on Neural Information Processing Systems (NIPS 2018), Oct. 22, 2018, 18 pages.

Petykiewicz, J. et al., "Active Nanophotonics: Inverse Design and Strained Germanium Light Emitters", A Dissertation Submitted to the Department of Electrical Engineering and the Committee on Graduate Studies of Stanford University, Oct. 2016. 134 pages.

Ying-Shou Lu, J., "Nanophotonic Computational Design", A Dissertation Submitted to the Department of Electrical Engineering and the Committee on Graduate Studies of Stanford University, Jun. 2013, 122 pages.

Piggott, A.Y., "Automated Design of Photonic Devices", A Dissertation Submitted to the Department of Electrical Engineering and the Committee on Graduate Studies of Stanford University, Jun. 2018, 112 pages.

Lu, J. et al., "Nanophotonic Computational Design", Optics Express, vol. 21, No. 11, Jun. 3, 2013, 17 pages.

Piggott, A. Y. et al., "Inverse Design and Implementation of a Wavelength Demultiplexing Grating Coupler", Scientific Reports, Nov. 27, 2014, 5 pages.

Piggott, A.Y. et al., "Inverse Design and Demonstration of a Compact and Broadband On-Chip Wavelength Demultiplexer", Nature Photonics, May 11, 2015, 5 pages.

Piggott, A.Y. et al., "Silicon Photonics: Design Approach to Integrated Photonics Explores Entire Space of Fabricable Devices", Laser Focus World, Aug. 13, 2018, 5 pages.

Piggott, A. Y. et al., "Fabrication-constrained Nanophotonic Inverse Design", Scientific Reports, May 11, 2017, 7 pages.

Su, L. et al., "Inverse Design and Demonstration of a Concept On-Chip Narrowband Three-Channel Wavelength Demultiplexer", ACS Photonics, Aug. 17, 2017, 6 pages.

Su, L. et al., Fully-Automated Optimization of Grating Couplers, Optics Express, vol. 26, No. 4m Feb. 2018, 12 pages.

Robinson, J.T., "First-Principle Derivation of Gain in High-Index-Contrast Waveguides", Optics Express, vol. 16, No. 21, Oct. 13, 2008, 11 pages.

Lalau-Keraly, C.M. et al., "Adjoint Shape Optimization Applied to Electromagnetic Design", Optical Society of America, 2013, 9 pages.

Wahab, A. et al., "Electromagnetic Time Reversal Algorithms and Source Localization in Lossy Dielectric Media", Communications in Theoretical Physics 62(6): Dec. 2014, 20 pages.

Ohmic Heating, Lumerical Knowledge Base, Retrieved from internet: <https://kb.lumerical.com/index.html> on Nov. 9, 2018, 1 pages.

Perfectly matched layer—Wikipedia, Retrieved from internet: <https://en.wikipedia.org/wiki/Perfectly_matched_layer> on Nov. 12, 2018, 4 pages.

Johnson, S., "Notes on Perfectly Matched Layers (PMLs)", Retrieved from internet: <https://math.mit.edu/~stevenj/18.369/pml.pdf>, Mar. 10, 2010, 18 pages.

Potter, M. et al., "A Review of the Total Field/Scattered Field Technique for the FDTD Method", FERMAT, vol. 19, Article 1, Jan. 2017, 13 pages.

* cited by examiner

PHYSICAL DEVICE OPTIMIZATION WITH REDUCED MEMORY FOOTPRINT VIA TIME REVERSAL AT ABSORBING BOUNDARIES

TECHNICAL FIELD

This disclosure relates generally to design tools, and in particular but not exclusively, relates to design tools for optical and electromagnetic devices.

BACKGROUND INFORMATION

Electromagnetic devices (e.g., optical devices, electrical devices, or otherwise) are devices that create, manipulate, propagate, and/or measure electromagnetic radiation. Their applications vary broadly and include, but are not limited to, acousto-optic modulators, optical modulators, optical ring resonators, distributed Bragg reflectors, lasers, lenses, transistors, waveguides, antennas, and the like. Conventional techniques for the design of these devices are sometimes determined through a simple guess and check method in which a small number of design parameters of a pre-determined design are adjusted for suitability to a particular application. However, in actuality, these devices may have design parameters ranging from hundreds all the way to many billions, dependent on the device size and functionality. As functionality of electromagnetic devices is increased and manufacturing tolerances improve to allow for smaller device feature sizes, it becomes increasingly important to take full advantage of these improvements via optimized device design.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1:
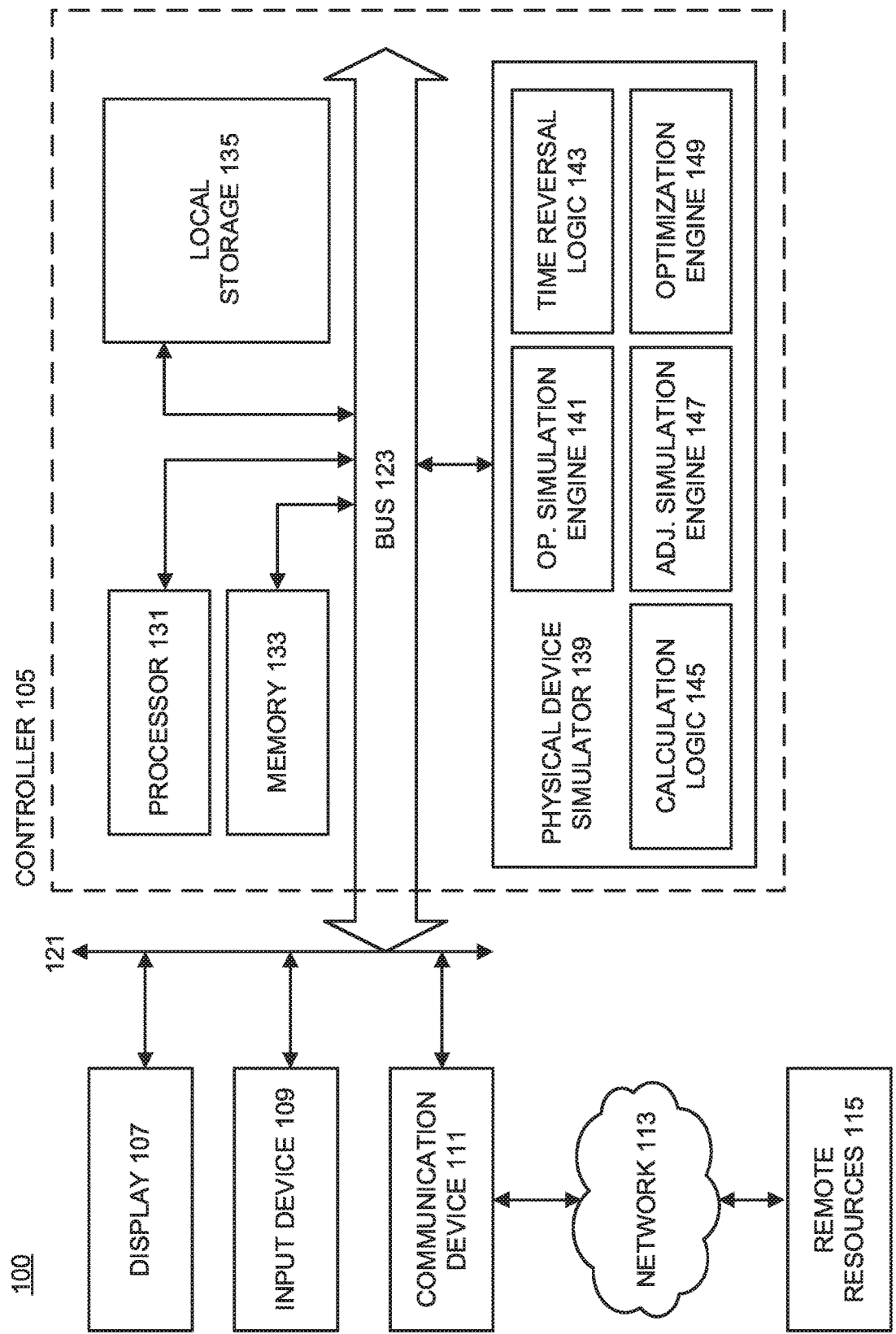
FIG. 1 is a block diagram illustrating a system for optimizing structural parameters of a physical device with a reduced memory footprint, in accordance with an embodiment of the present disclosure.

Embodiments of a system, apparatus, and method for physical device optimization with reduced memory footprint via time reversal at absorbing boundaries are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Described herein are embodiments of a physics simulator that may be utilized to optimize structural parameters of physical devices (e.g., electromagnetic devices) based on first-principles simulations. In particular, the physics simulator allows for a first-principles based design and optimization of devices based on their optical, electrical, magnetic, acoustic, and/or fluidic response (e.g., field response) to an excitation source. The physics simulator utilizes physical partial-differential equation (PDE) systems to model these optical, electrical, mechanical, fluidic, quantum dynamic, and the like systems within a simulated environment to perform operational and adjoint simulations of a physical device. The operational simulation simulates the field response of the simulated environment, including the physical device, to an excitation source to determine a performance metric of the physical device. The adjoint simulation backpropagates a loss metric (e.g., loss function) tied to the performance metric within the simulated environment to determine the influence of structural parameters of the physical device on the loss metric. However, the large state sizes (e.g., from the physical device being represented in three-dimensions, or other dimensionality, by a quantity of voxels ranging from hundreds all the way to many billions) and simulation time steps (e.g., from hundreds to millions or billions of time steps) necessary to perform the operational and adjoint simulations of the physical device using PDE systems may be intractable in terms of memory footprint.

In some embodiments, the operational simulation includes an output (e.g., outgoing electromagnetic radiation or waves, in the case of an electromagnetic device) from the excitation source that may propagate (e.g., reflect, refract, diffract, scatter, and/or be absorbed) within the simulated environment (e.g., scattered off of an internal structure that is part of the physical device being simulated and may correspond to structural parameters of the physical device). The output may be simulated as a field response of the simulated environment. For example, changes in individual field values of the field response over time may correspond to a wave (e.g., electromagnetic radiation) propagating through the simulated environment. The structural parameters of the physical device may be optimized by determining how changes in the structural parameters influence a loss metric that may be determined by going backwards through the physics equations that describe the field response (e.g., Maxwell's equations for electromagnetic devices) via an adjoint of the operational simulation (e.g., adjoint simulation). However, it may be necessary to know and record the field response to the simulated environment at every point in time and space (e.g., for the duration of the simulation and within the simulated environment) for determining the influence of changes in the structural parameters on the loss metric, which due to the large state sizes, may be intractable.

To reduce the memory footprint of the adjoint simulation (e.g., backpropagation of the loss metric), embodiments described herein illustrate how to circumvent the need to record the field response at every point in space and time. More specifically, during the operational simulation, attenuated field values of simulated environment associated with one or more absorbing boundaries (e.g., perfectly matched layers, absorbing mediums of the physical device, or otherwise) are recorded. In some embodiments, the attenuated field values correspond to a portion of the field values of the field response that are immediately prior or otherwise proximate to (e.g., spatially within the simulate environment) the absorbing boundaries. In other words, when performing the operational simulation, information that is lost or otherwise is not preserved within the simulation domain is considered to be "absorbed," which is recorded, and may be subsequently replayed in reverse order of the recordation and simulated within the simulated environment (e.g., reverse simulation) to recover or otherwise regenerate the field response that is substantially equivalent to the field response generated during the operational simulation without actually storing the entirety of the field response at every point in time and space. Thus an absorbing medium may be considered to be any boundary or medium within or proximate to the simulation domain (e.g. simulated environment) that results in information (e.g., field values at specific voxel locations or proximate to boundaries within the simulated environment) being lost or otherwise not preserved. Once the operational simulation reaches a steady state (or at least after any initial startup transients have decayed to negligible values or otherwise concludes) the field values proximate to the absorbed boundaries that have been compactly recorded may be "replayed" to recover field values of interest that are utilized for performing the adjoint simulation when propagating the gradient of the loss function (e.g., loss metric) to the point where the gradient informs how to change the structural parameters at target locations (e.g., of one or more voxels representing the physical device).

In some embodiments, the attenuated field values may be stored (e.g., recorded) in a compressed representation (e.g., a running Fourier transform may be used to compress the attenuated field values and convert them from the time domain to the frequency domain). In particular, electromagnetic devices may operate at one or more frequencies of interest, and thus storing the attenuated field values in a reduced representation via the frequency domain may further reduce the memory footprint. In the same or other embodiments, the attenuated field values may be subsampled over a plurality of time steps of the operational simulation rather than being recorded at each of the time steps. The subsampled values may subsequently be interpolated to regenerate substantially the same attenuated field values as what would be recorded if the attenuated field values were sampled at each time step of the simulation. Advantageously, embodiments described herein may reduce storage requirements. For example, the variables necessary to store the field response of the simulated environment may be reduced from $O(n^3)$ to $O(n^2)$ by recording the attenuated field values and replaying them to recover the field response. Storing the attenuated field values in a compressed representation may further reduce the memory footprint, which is related to the size of voxels (e.g., how finely meshed the computational grid of the simulated environment is) with respect to the size of the excitation source (e.g., wavelength of light being simulated). This is due, in part, because the number of propagating modes (that will leave the simulation domain) may be determined by the size of the simulation domain, but the total number of modes (e.g., propagating and non-propagating) may be determined by the number of grid points in the simulation domain. Thus, for simulation domains with heavily sub-wavelength gridding, the degree of reduced representation may be significantly advantageous in terms of memory savings. Furthermore, the embodiments described herein are compatible with non-linear problems (e.g., due to physical device including non-linear optical materials).

As mentioned above, the physics simulator allows for first-principles based design of novel devices with a reduced memory footprint by recording attenuated field values and replaying them to recover the field response. This has applications in a wide variety of fields, including but not limited to, mechanical devices, optical devices, electromagnetic devices, quantum-dynamic devices, lasers, lenses, mechanical structures, transistors, and the like. Advantageously, this first-principles based design is not dependent on human intuition or expertise and generally may result in designs which outstrip current state-of-the-art designs and simultaneous, scalable optimization of a nearly unlimited number of design parameters may be achieved.

FIG. 1 is a block diagram illustrating system 100 for optimizing structural parameters of a physical device with a reduced memory footprint, in accordance with an embodiment of the present disclosure. In the following embodiments, the system 100 will be described in the context of an optical waveguide as corresponding to the physical device. However, it is appreciated that the physical device is not limited to optical waveguides, and that other devices such as optical and electromagnetic devices (e.g., acousto-optic modulators, optical modulators, optical couplers, optical ring resonators, distributed Bragg reflectors, lasers, lenses, transistors, waveguides, antennas, optoelectronic switches, grating couplers, and the like), mechanical structures, and the like may be represented by the term "physical device." More specifically, system 100 provides first-principles based design and optimization of devices based on their optical, electrical, magnetic, acoustic, and/or fluidic response (e.g., field response) to an excitation source. In other words, it is appreciated that system 100 is not limited to modeling operation of optical waveguides, and that other devices having a field response to an excitation source may also be modeled and subsequently have structural parameters optimized.

As illustrated, system 100 includes controller 105, display 107, input device(s) 109, communication device(s) 111, network 113, remote resources 115, bus 121, and bus 123.

Controller 105 includes processor 131, memory 133, local storage 135, and physical device simulator 139. Physical device simulator 139 includes operational simulation engine 141, time reversal logic 143, calculation logic 145, adjoint simulation engine 147, and optimization engine 149. It is appreciated that in some embodiments, controller 105 may be a distributed system.

Controller 105 is coupled to display 107 (e.g., a light emitting diode display, a liquid crystal display, and the like) coupled to bus 121 through bus 123 for displaying information to a user utilizing system 100 to optimize structural parameters of the electromagnetic device with a reduced memory footprint. Input device 109 is coupled to bus 121 through bus 123 for communicating information and command selections to processor 131. Input device 109 may include a mouse, trackball, keyboard, stylus, or other computer peripheral, to facilitate an interaction between the user and controller 105. In response, controller 105 may provide verification of the interaction through display 107.

Another device, which may optionally be coupled to controller 105, is a communication device 111 for accessing remote resources 115 of a distributed system via network 113. Communication device 111 may include any of a number of networking peripheral device such as those used for coupling to an Ethernet, Internet, or wide area network, and the like. Communication device 111 may further include a mechanism that provides connectivity between controller 105 and the outside world. Note that any or all of the components of system 100 illustrated in FIG. 1 and associated hardware may be used in various embodiments of the present disclosure. The remote resources 115 may be part of a distributed system and include any number of processors, memory, and other resources for optimizing the structural parameters of the physical device with a reduced memory footprint.

Controller 105 orchestrates operation of system 100 for optimizing structural parameters of the physical device. Processor 131 (e.g., one or more central processing units, graphics processing units, and/or tensor processing units, etc.), memory 133 (e.g., volatile memory such as DRAM and SRAM, non-volatile memory such as ROM, flash memory, and the like), local storage 135 (e.g., magnetic memory such as computer disk drives), and the physical device simulator 139 are coupled to each other through bus 123. Controller 105 includes software (e.g., instructions included in memory 133 coupled to processor 131) and/or hardware logic (e.g., application specific integrated circuits, field-programmable gate arrays, and the like) that when executed by controller 105 causes controller 105 or system 100 to perform operations. The operations may be based on instructions stored within any one of, or a combination of, memory 133, local storage 135, physical device simulator 139, and remote resources 115 accessed through network 113.

In the illustrated embodiment, modules 141-149 of physical device simulator 139 are utilized to optimize structural parameters of the physical device (e.g., an optical waveguide) with a reduced memory footprint. In some embodiments, system 100 may optimize the structural parameters of the physical device via, inter alia, simulations (e.g., operational and adjoint simulations) that utilize a finite-difference time-domain (FDTD) method to model the field response (e.g., electric and magnetic fields when the physical device is an electromagnetic device). The operational simulation engine 141 provides instructions for performing a simulation of the physical device operating in response to an excitation source within a simulated environment. In particular, the operational simulation determines a field response of the simulated environment (and thus the physical device, which is described by the simulated environment) in response to the excitation source for determining a performance metric of the physical device (e.g., based off an initial description or input design of the physical device that describes the structural parameters of the physical device within the simulated environment with a plurality of voxels). The structural parameters may correspond, for example, to the specific design, material compositions, dimensions, and the like of the physical device. Time reversal logic 143 provides instructions for recording attenuated field values during the operational simulation and then performing a reverse simulation to recover the field response or field gradients of the simulated environment by "replaying" the attenuated field values in reverse from later to earlier time steps. The attenuated field values correspond to information lost due to absorbing boundaries within the simulated environment during the operational simulation that attenuate an output of the excitation source. In one embodiment, the attenuated field values are represented by field values of one or more of the plurality of voxels proximate to the absorbing boundaries. Changes in the field response over a plurality of time steps during the operational simulation due to the excitation source correspond to the output of the excitation source (e.g., waves or radiation generated by or in response to the excitation source). The waves or radiation propagating through the simulated environment due to the excitation source may be attenuated (e.g., reduced to a null value, or otherwise reduced) when reaching an absorbing boundary. Thus, in some embodiments, the attenuated field values may correspond to the field values of a portion of the plurality of voxels proximate to the absorbing boundaries recorded at a time step that is immediately prior to the attenuation. Calculation logic 145 computes a loss metric of the physical device based, at least in part, on the performance metric of the physical device. Adjoint simulation engine 147 is utilized in conjunction with the operational simulation engine 141 to perform an adjoint simulation of the physical device to backpropagate the loss metric through the simulated environment to determine how changes in the structural parameters of the physical device influence the loss metric. Optimization engine 149 is utilized to update the structural parameters of the physical device to reduce the loss metric and generate a revised description of the physical device.

FIGS. 2A-2D respectively illustrate an initial set up of a simulated environment 201-A describing a physical device, a one-dimensional representation of the simulated environment 201-B, performing an operational simulation of the physical device operating in response to an excitation source within the simulated environment 201-C, and performing an adjoint simulation of the physical device within the simulated environment 201-D. The initial set up of the simulated environment 201, 1-dimensional representation of the simulated environment 201, operational simulation of the physical device, and adjoint simulation of the physical device may be implemented with system 100 illustrated in FIG. 1. As illustrated in FIGS. 2A-2D, simulated environment 201 is represented in one- or two-dimensions. However, it is appreciated that higher (e.g., 3-dimensional space) dimensionality may also be used to describe simulated environment 201 and the physical device. In some embodiments, optimization of structural parameters of the physical device illustrated in FIGS. 2A-2D may be achieved via, inter alia, simulations (e.g., operational simulations and adjoint simulations) that utilize a finite-difference time-domain (FDTD) method to model the field response (e.g., electric and magnetic field) to an excitation source.

Figure 2A:
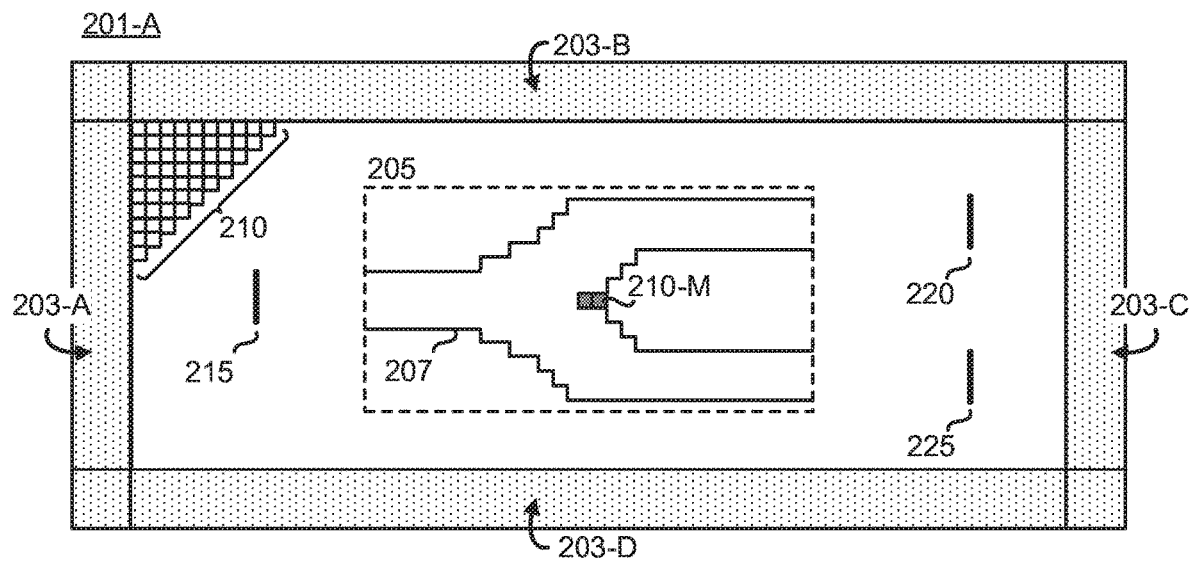
FIG. 2A illustrates a demonstrative simulated environment describing a physical device and including absorbing boundaries, in accordance with an embodiment of the present disclosure.

FIG. 2A illustrates a demonstrative simulated environment 201-A describing an optical waveguide (i.e., a physical device) and including absorbing boundaries (e.g., perfectly matched layers 203-A, 203-B, 203-C, 203-D and absorbing medium 210-M), in accordance with an embodiment of the present disclosure. More specifically, in response to receiving an initial description of a physical device defined by one or more structural parameters (e.g., an input design), a system (e.g., system 100 of FIG. 1) configures a simulated environment 201 to be representative of the physical device. As illustrated, the simulated environment 201 (and subsequently the physical device) is described by a plurality of voxels 210, which represent individual elements (i.e., discretized) of the two-dimensional (or other dimensionality) space. Each of the voxels is illustrated as two-dimensional squares; however, it is appreciated that the voxels may be represented as cubes or other shapes in three-dimensional space. It is appreciated that the specific shape and dimensionality of the plurality of voxels 210 may be adjusted dependent on the simulated environment 201 and physical device being simulated. It is further noted that only a portion of the plurality of voxels 210 are illustrated to avoid obscuring other aspects of the simulated environment 201.

Each of the plurality of voxels 210 may be associated with a structural value, a field value, and a source value. Collectively, the structural values of the simulated environment 201 describe the structural parameters of the physical device. In one embodiment, the structural values may correspond to a relative permittivity, permeability, and/or refractive index that collectively describe structural (i.e., material) boundaries of the physical device. For example, an interface 207 is representative of where relative permittivity changes within the simulated environment 201 and may define a boundary of the physical device where a first material meets or otherwise interfaces with a second material. The field value describes the field (or loss) response that is calculated (e.g., via Maxwell's equations) in response to an excitation source described by the source value. The field response, for example, may correspond to a vector describing the electric and/or magnetic fields (e.g., in one or more orthogonal directions) at a particular time step for each of the plurality of voxels 210. More specifically, the vector may correspond to a Yee lattice to discretize Maxwell's equations for determining the field response. Thus, the field response may be based, at least in part, on the structural parameters of the physical device and the excitation source.

In the illustrated embodiment, the physical device corresponds to an optical waveguide having a design region 205, in which structural parameters of the physical device may be updated. The simulated environment 201 may include an input port 215 of the physical device corresponding to a location of an excitation source to provide an output (e.g., a Gaussian pulse, a wave, a waveguide mode response, and the like). The output of the excitation source originates at the input port and is positioned to propagate (or otherwise influence the field values of the plurality of voxels) through the design region 205 towards output ports 220 and 225 of the physical device. In the illustrated embodiment, the input port 215 and output ports 220 and 225 are positioned outside of the design region 205. In other words, in the illustrated embodiment, only a portion of the structural parameters of the physical device is optimizable. However, in other embodiments, the entirety of the physical device may be placed within the design region 205 such that the structural parameters may represent any portion or the entirety of the design of the physical device. The electric and magnetic fields within the simulated environment 201 (and subsequently the physical device) may change (e.g., represented by field values of the individual voxels that collectively correspond to the field response of the simulated environment) in response to the excitation source. The output ports 220 and 225 of the optical waveguide may be used for determining a performance metric of the physical device in response to the excitation source (e.g., power, waveguide mode, etc.). The initial description of the physical device, including initial structural parameters, excitation source, performance parameters or metrics, and other parameters describing the physical device, are received by the system (e.g., system 100 of FIG. 1) and used to configure the simulated environment 201 for performing a first-principles based simulation of the physical device. These specific values and parameters may be defined directly by a user (e.g., of system 100 in FIG. 1), indirectly (e.g., via controller 105 culling pre-determined values stored in memory 133, local storage 135, or remote resources 115), or a combination thereof.

As illustrated in FIG. 2A, simulated environment 201-A includes perfectly matched layers (PMLs) 203-A, 203-B, 203-C, and 203-D, which surround the plurality of voxels and correspond to outer boundaries of the computational domain for the simulated environment 201. PMLs 203 are artificial absorbing layers (i.e., absorbing boundaries) of the simulation (e.g., operational and/or adjoint simulations) that attenuate outgoing waves. The PMLs 203 may correspond to split-field PMLs, uniaxial PMLs, stretched-coordinate PMLs, and other types of PMLs dependent on the simulation, which may be utilized to represent open boundaries (e.g., free space) of the simulated environment 201 without the computation burden of actually simulating the open boundaries. In some embodiments the outgoing waves correspond to changes in the field values of the simulated environment influenced by the excitation source that propagate through the simulated environment and are attenuated proximate to the PML/non-PML interface (e.g., an absorbing boundary such as the PML/voxel interface). More specifically, PMLs 203 do not reflect outgoing waves that may otherwise generate erroneous field values. Rather, outgoing waves that reach the PML/non-PML interface are strongly absorbed (i.e., attenuated to a substantially null value) within the PMLs 203, and thus removed from the computational domain of the simulation. In some embodiments the physical device may include one or more absorbing mediums (e.g., metal voxel 210-M, non-linear optical materials, or otherwise) that are part of the structural parameters of the physical device and also attenuate (e.g., via joule heating, the skin effect, and the like) the output of the excitation source during the simulation, which may be representative by changes in the field value of one or more of the plurality of voxels proximate to the absorbing medium or within the voxels representative of the absorbing medium itself. It is appreciated that field values of the voxels associated with or proximate to the attenuation may correspond to attenuated field values.

Figure 2B:
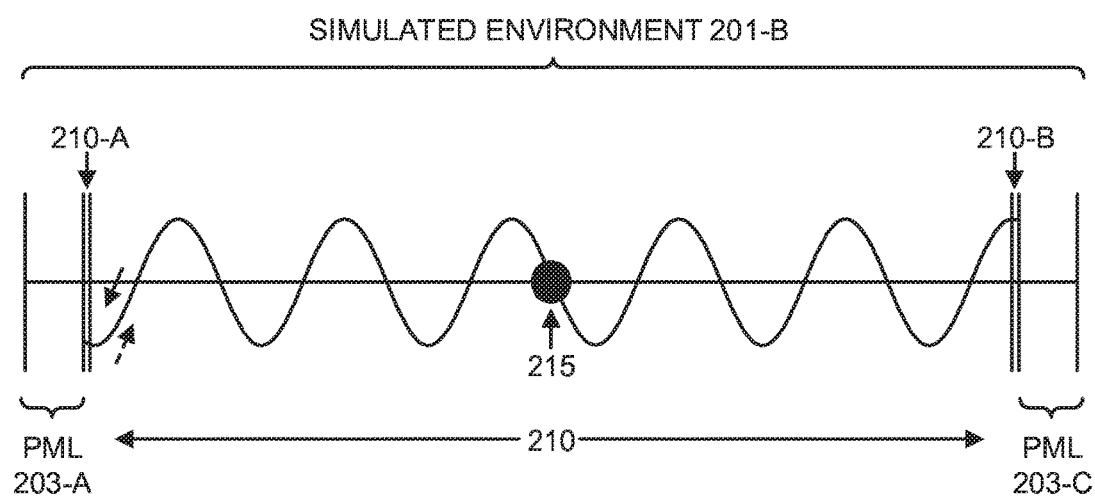
FIG. 2B illustrates an example one-dimensional simulated environment with absorbing boundaries and an excitation source, in accordance with an embodiment of the present disclosure.

FIG. 2B illustrates an example one-dimensional simulated environment 201-B with absorbing boundaries 203-A and 203-B and excitation source 215, in accordance with an embodiment of the present disclosure. More specifically, simulated environment 201-B is a simplified representation (e.g., in one-dimension) of the two-dimensional simulated environment 201-A illustrated in FIG. 2A. Referring back to FIG. 2B, simulated environment 201-B includes a plurality of voxels 210 disposed between PMLs 203-A and 203-C. It is appreciated that only first voxel 210-A and second voxel 210-B, which are respectively adjacent to PML 203-A and 203-B, respectively, are illustrated and that other voxels included in the plurality of voxels 210 are not illustrated to avoid obscuring certain aspects of the illustration. The individual voxels collectively correspond to a computational grid for simulating a field response of the simulated environment 201-B to excitation source 215 (e.g., via an FDTD method in which Maxwell's equations are used to simulate the physics of the excitation source influencing the field response).

In the illustrated embodiment, an output of excitation source 215 corresponds to a wave (e.g., electromagnetic radiation) that oscillates over time due to a pre-determined spatial profile of the output and may be represented by changes in the field values of the voxels during the plurality of time steps of the operational simulation. The output may propagate (e.g., reflect, refract, diffract, scatter, absorb, etc.) through the simulated environment 201-B and reach first voxel 210-A and/or second voxel 210-B before being absorbed by PML 203-A and/or PML 203-C. It is noted that the size of the plurality of voxels 210 is exaggerated for clarity of illustration. For example, the wave (e.g., output from excitation source 215) that reaches first voxel 210-A is shown as substantially changing within the first voxel 210-A. In some embodiments, the plurality of voxels 210 represent discretized values of the simulation (e.g., the field, source, and/or structural parameters of each of the plurality of voxels are represented by a scaler, vector, or tensor). The particular illustration of FIG. 2B, is representative of a singular snapshot in time of the simulated environment 201-B during the operational simulation. The simulation includes a plurality of time steps in which the field values of voxels 210-A and/or 210-B change responsive to the excitation source 215 just prior to being attenuated (e.g. absorbed) by absorbing boundaries (e.g., PMLs 203). During the operational simulation (represented by the solid arrow illustrated in FIG. 2B), attenuated field values may be recorded just prior to being absorbed (e.g., by PMLs 203-A and 203-B) along with a final state (e.g., steady state or the operational simulation otherwise concludes) of the simulation to recover the field response (e.g., field values at each of the plurality of voxels for each of the plurality of time steps). Rather than saving the field values at each of the plurality of voxels, a reverse simulation (represented the dashed arrow illustrated in FIG. 2B) may be performed in which the saved attenuated field values are replayed (e.g., in reverse temporal order) as excitation sources to recover the field response (e.g., field values for each of the plurality of voxels at each of the plurality of time steps). Advantageously, the memory footprint for recovering the field response is significantly less by replaying the attenuated field values relative to storing the field values for each of the plurality of voxels at each of the plurality of time steps of the operational simulation.

It is further appreciated that the attenuated field values may be stored in a reduced (e.g., compressed) representation. In one embodiment, the attenuated field values may be transitioned from a temporal domain to a frequency domain (e.g., via a Fourier transform), in embodiments where the physical device operates at one or more frequencies of interest. In the same or other embodiments, the attenuated field values may be subsampled such that there is a less than a one-to-one correspondence between the number of time steps in the operational simulation and the number of recorded attenuated field values (e.g., one recorded attenuated field value for every three time steps, and the like). The unrecorded attenuated field values may be determined or otherwise computed via interpolation, for example, to substantially recover the attenuated field values for each of the plurality of time steps of the operational simulation. In some embodiments, the subsampling may be temporal subsampling, spatial subsampling, or a combination thereof. For example, at a PML/non-PML interface, the attenuated field values may be stored associated with every other voxel that interfaces with PML 203. Additionally, or alternatively, a temporal subsample may record the attenuated field values at every other time step, for example. The compressed representation of the attenuated field values may further reduce the memory footprint of the simulation.

Figure 2C:
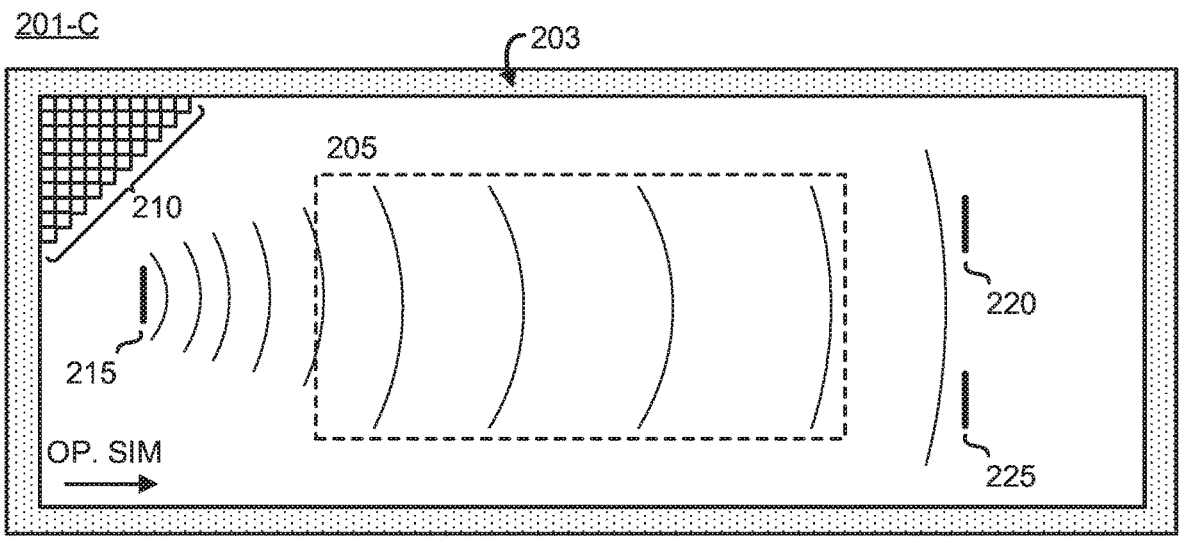
FIG. 2C illustrates an example operational simulation of the physical device in response to an excitation source within a simulated environment, in accordance with an embodiment of the present disclosure.

FIG. 2C illustrates an example operational simulation of the physical device in response to an excitation source within simulated environment 201-C, in accordance with an embodiment of the present disclosure. The demonstrative simulated environment 201-C represents a particular time step when performing an operational simulation of the physical device (e.g., optical waveguide) operating in response to an excitation source (e.g., electromagnetic radiation or waves originating at the input port 215 that propagates through the simulated environment 201). It is noted that the plurality of voxels 210 are surrounded by PML 203, which are artificial absorbing boundaries that strongly absorb electromagnetic radiation (e.g., from the output of the excitation source) incident on the PML/non-PML interface (e.g., where the plurality of voxels meet PML 203). As a consequence of the strong absorption, PML 203 prevents reflections of the electromagnetic radiation (e.g., the output of the excitation source) at the PML/non-PML interface. In other words, PML 203 allows for the operational simulation of the physical device to be placed in "free space" without the computational burden of simulating "free space." Put in another way, PML 203 narrows the computational domain by truncating regions corresponding to open boundaries. During the operational simulation, the field values proximate to the absorbing boundaries may be recorded or otherwise saved in lieu of recording the field values at every point in time (e.g., for the duration of the simulation) and space (e.g., within the simulated environment 201).

In the illustrated embodiment, the physical device is an optical waveguide operating at one or more frequencies of interest and having one or more particular waveguide modes (e.g., transverse electric mode, transverse magnetic mode, or transverse electric and magnetic mode). The excitation source is at an input of the optical waveguide (e.g., input port 215) having a specified spatial, phase, and/or temporal profile. The operational simulation occurs over a plurality of time steps, including the illustrated time step. When performing the operational simulation, changes to the field response (e.g., the field value) for each of the plurality of voxels 210 are updated in response to the excitation source incrementally over the plurality of time steps and based, at least in part, on the structural parameters. Similarly, in some embodiments the source value of the plurality of voxels is updated (e.g., based on the spatial profile and/or temporal profile describing the output of the excitation source). It is appreciated that the operational simulation is incremental and that the field values (and source values) of the simulated environment 201 are updated incrementally at each time step as time moves forward for each of the plurality of time steps during the operational simulation. It is further noted that in some embodiments, the update is an iterative process and that the update of each field and source value is based, at least in part, on the previous update of each field and source value.

Once the operational simulation reaches a steady state (e.g., changes to the field values in response to the excitation source stabilize, decreases to negligible values, or otherwise concludes) one or more performance metrics may be determined. In one embodiment, the performance metric corresponds to the output mode of the optical waveguide at output ports 220 and 225. In the same or other embodiments, the performance metric represents power (at one or more frequencies of interest) in the target mode shape at the specific locations of the output ports 220 and 225. A loss metric of the input design (e.g., the initial design and/or any refined design in which the structural parameters have been updated) based, at least in part, on the performance metric may be determined, which in conjunction with an adjoint simulation may be utilized to determine a structural gradient (e.g., influence of structural parameters on loss metric) for updating or otherwise revising the structural parameters to reduce the loss metric (e.g., increase performance).

Figure 2D:
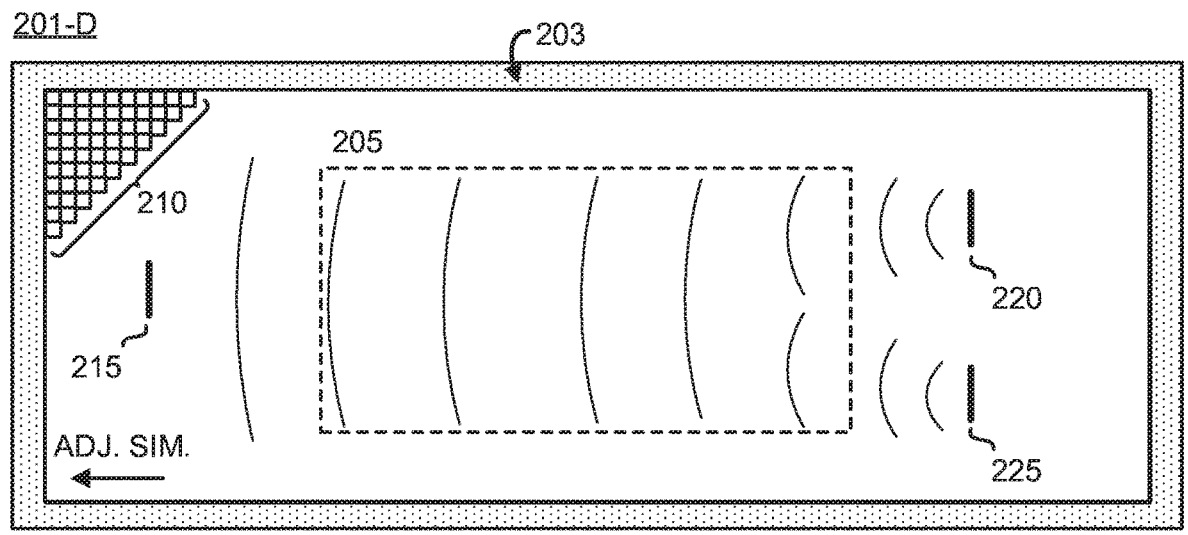
FIG. 2D illustrates an example adjoint simulation within the simulated environment by backpropagating a loss metric, in accordance with an embodiment of the present disclosure.

FIG. 2D illustrates an example adjoint simulation within the simulated environment 201-D by backpropagating the loss metric, in accordance with an embodiment of the present disclosure. More specifically, the adjoint simulation is utilized in combination with the operational simulation to determine how changes in the structural parameters of the physical device influence the loss metric (e.g., of the loss function). It is noted that the simulated environment 201-D includes a plurality of voxels 210 that are surrounded by PML layer 203 that has similar functionality as described in relation to FIG. 2C, for example. Referring back to FIG. 2C, in some embodiments, the adjoint simulation is performed by backpropagating the loss metric through the simulated environment 201 in reverse (e.g., from a later to earlier time steps). In other words, an adjoint (or virtual) source based on the loss metric is placed at the waveguide output ports 220 and 225. The adjoint source(s) is then treated as an excitation source during the adjoint simulation. A loss response of the simulated environment is computed for each of the plurality of time steps (e.g., backwards in time) in response to the adjoint source. The loss response collectively refers to loss values of the plurality of voxels that are incrementally updated in response to the adjoint source over the plurality of time steps. The change in the loss response based on the loss metric corresponds to a loss gradient that may be combined with the field gradient (e.g., change in the field response with respect to the excitation source) to determine a structural gradient of the physical device. In order to reduce the memory footprint of the simulations the field response of the operational simulation is not recorded at every point in space and time within the simulated environment. Rather, the attenuated field values are replayed in a reversed order of being recorded (e.g., time reversal) to perform a reverse simulation in which the attenuated field values are treated as excitation source. The reverse simulation is subsequently performed until the target field response at a particular time step or location within the computational domain is recovered to combine with the loss response for determining the structural gradient. The structural gradient is indicative of how changes in the structural parameters of the physical device influence the loss metric. Once known, the structural parameters may be updated to reduce the loss metric and generate a revised description of the physical device.

In some embodiments, iterative cycles of the operational simulation and adjoint simulation are performed successively using an optimization scheme such as gradient descent to adjust or otherwise update the structural parameters of the physical device to reduce the loss metric. More specifically, after each cycle the structural parameters are updated (e.g., optimized) to reduce the loss metric. The operational simulation, adjoint simulation, and updating of the structural parameters are repeated successively until the loss metric substantially converges or is otherwise below or within a threshold value or range.

Figure 3A:
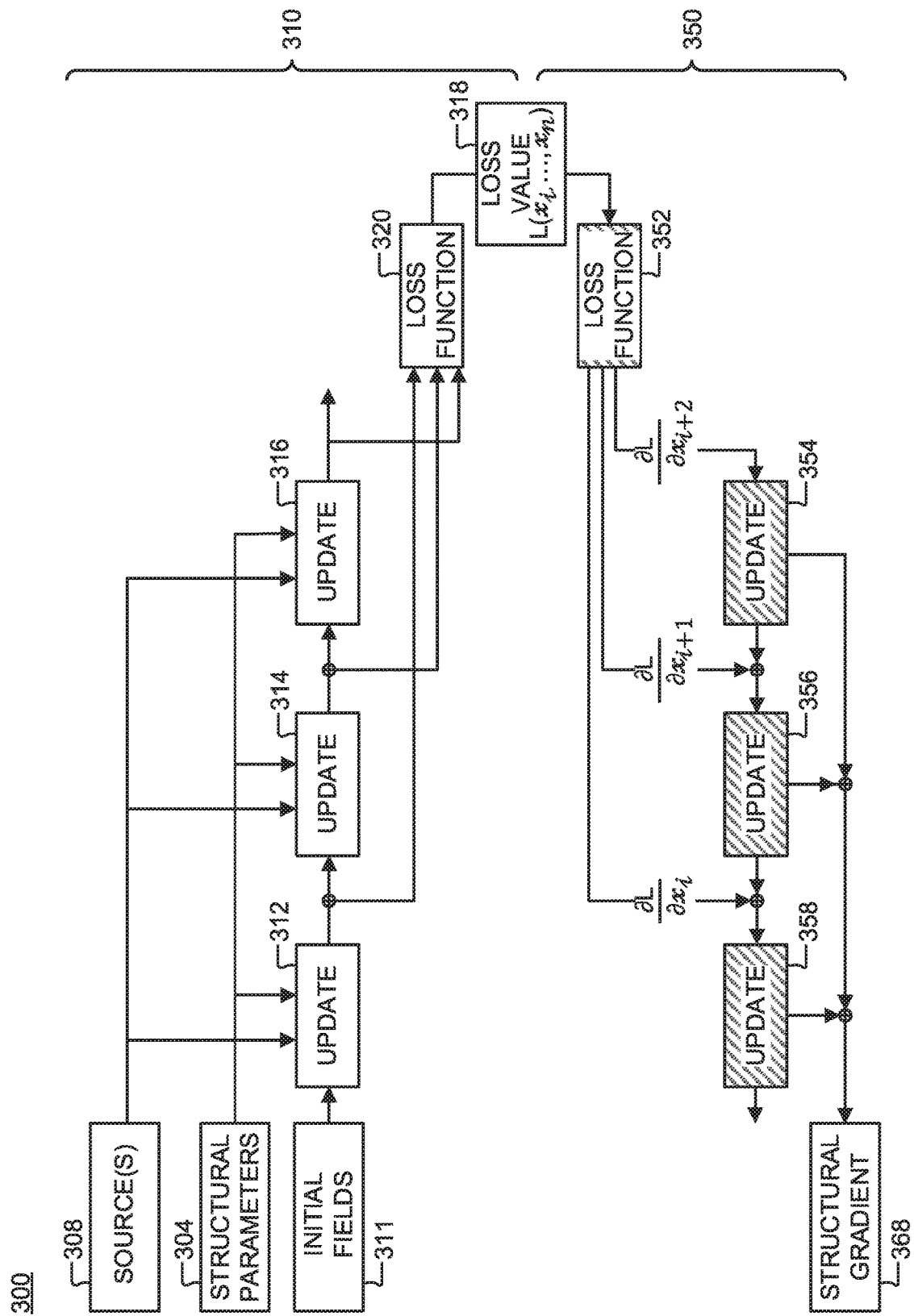
FIG. 3A is a flow chart illustrating example time steps for an operational simulation and adjoint simulation of a physical device within a simulated environment, in accordance with an embodiment of the present disclosure.

FIG. 3A is a flow chart 300 illustrating example time steps for the operational simulation 310 and adjoint simulation 350 of a physical device within a simulated environment, in accordance with an embodiment of the present disclosure. Flow chart 300 is one possible implementation that a system (e.g., system 100 of FIG. 1) may use to perform the operational simulation 310 and adjoint simulation 350 of the simulated environment (e.g., simulated environment 201 of FIGS. 2A-2D) describing a physical device (e.g., an electromagnetic or other device). In the illustrated embodiment, the operational simulation utilizes a finite-difference time-domain (FDTD) method to model the field response (both electric and magnetic) at a plurality of time steps in response to one or more excitation sources. More specifically, the time-dependent Maxwell's equations (in partial differential form) are discretized to solve for field vector components (e.g. the field values of each of the plurality of voxels 210 of the simulated environment 201 in FIGS. 2A-2D that collectively correspond to the field response) over a plurality of time steps.

As illustrated in FIG. 3A, flow chart 300 includes update operations for a portion of operational simulation 310 and adjoint simulation 350 (e.g., for backwards propagation of the loss metric). The operational simulation 310 occurs over a plurality of time steps (e.g., from an initial time step to a final time step over a pre-determined or conditional number of time steps having a specified time step size) and models changes (e.g., from the initial field values 311) in electric and magnetic fields of a plurality of voxels describing the simulated environment and/or physical device that collectively correspond to the field response based, at least in part, on structural parameters 304 of the simulated environment that describe the physical device operating in response to one or more excitation sources 308. More specifically, update operations (e.g., 312, 314, and 316) are iterative and based on the field response, structural parameters 304, and one or more physical stimuli sources 308. Each update operation is succeeded by another update operation, which are representative of successive steps forward in time within the plurality of time steps. For example, update operation 314 updates the field values 309 (see, e.g., FIG. 3B) based on the field response determined from the previous update operation 312, sources 308, and the structural parameters 304. Similarly, update operation 316 updates the field values 317 (see, e.g., FIG. 3B) based on the field response determined from the update operation 314. In other words, at each time step of the operational simulation the field values (and thus field response) are updated based on the previous field response and structural parameters of the physical device. Additionally, at each time step a contribution to the loss metric (e.g., by loss function 320) is tracked until the final time step is reached or the operational simulation otherwise concludes in order to determine the total loss 318 (e.g., the loss metric). The contribution to the loss value based on the field response may correspond to a performance metric of the physical device compared to a target performance parameter.

Rather than storing the field response at each of the plurality of time steps for each of the plurality of voxels, the contribution to the loss value may be tracked by recording the field values of the plurality of voxels proximate to absorbing boundaries (e.g., in order to provide a reduced representation of the field response/loss contribution). The recorded field values proximate to the absorbing boundaries correspond to attenuated field values. The loss gradients determined from block 352 based on the loss value 318 may be treated as an adjoint or virtual source (e.g., physical stimuli or excitation source originating at an output region) which are backpropagated in reverse (e.g., as in a time-backwards simulation from the final time step incrementally through the plurality of time steps until reaching the initial time step) to determine the structural gradient 368. However, to perform the adjoint simulation it is necessary to know the field response at each point in time and space (e.g., of the operational simulation). The necessary field response values may be recovered by performing a reverse simulation (e.g., where the attenuated field values are treated as excitation sources) to obtain the gradients from 352 to perform update operations 354, 356, 358, which are utilized to determine a contribution or influence of changes to the structural parameters on the loss metric (e.g., the structural gradient 368).

In the illustrated embodiment, the FDTD solve (e.g., operational simulation 310) and backward solve (e.g., adjoint simulation 350) problems are described pictorially, from a high-level perspective, using only "update" and "loss" operations as well as their corresponding gradient operations. The simulation is set up initially in which the structural parameters, excitation source, and initial field states of the simulated environment (and physical device) are provided. As discussed previously, the field values are incrementally updated in response to the excitation source based on the structural parameters. More specifically, the update operation is given by $\phi$, where $x_{i,+1} = \phi(x_i, b_i, z_i)$ for $i, = 1, \ldots n$. Here, n, corresponds to the total number of time steps (e.g., the plurality of time steps) for the operational simulation, $x_i$, corresponds to the field response (e.g., the field values associated with the electric and/or magnetic fields of each of the plurality of voxels) of the simulated environment at time step $i, $, $b_i$ corresponds to the excitation source(s) (e.g., the source values associated with the electric and/or magnetic fields for the voxels representative of the excitation source) of the simulated environment at time step $i$, and $z$ corresponds to the structural parameters describing the topology and/or material properties of the electromagnetic device (e.g., relative permittivity, index of refraction, etc.). It is noted that using the FDTD method, the update operation can specifically be stated as:

$$\phi(x_i, b_i, z) = A(z,)x_i + B(z,)b_i. \quad (1)$$

That is to say the FDTD update is linear with respect to the field and source terms. Concretely, $A(z,) \in \mathbb{R}^{N \times N}$ and $B(z,) \in \mathbb{R}^{N \times N}$ are linear operators which depend on the structure parameters, $z,$, and act on the fields, $x_i,$, and the sources, $b_i,$, respectively. Here, it is assumed that $x_i, b_i \in \mathbb{R}^N$ where N is the number of FDTD field components in the operational simulation. Additionally, the loss operation (e.g., loss function) is given by $L = f(x_i, \ldots, x_n)$, which takes as input the computed fields and produces a single, real-valued scalar (e.g., the loss metric) that can be reduced and/or minimized.

In terms of optimizing the structural parameters of the physical device, the relevant quantity to produce is $$\frac{dL}{dz}$$

(e.g., structural gradient), winch is used to describe the change in the loss metric with respect to a change in the structural parameters of the physical device and is denoted as the "structure gradient" illustrated in FIG. 3A.

Figure 3B:
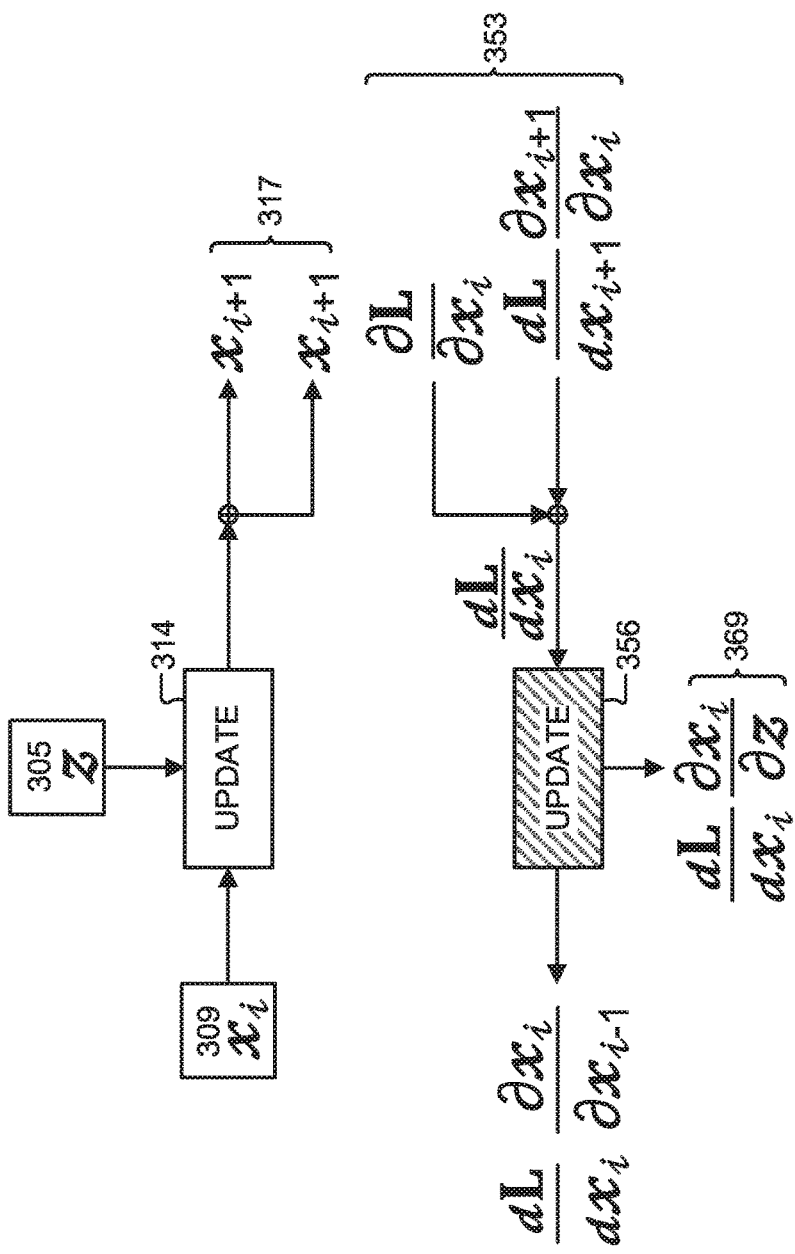
FIG. 3B is a chart illustrating a relationship between an operational simulation and adjoint simulation, in accordance with an embodiment of the present disclosure.

FIG. 3B is a chart 380 illustrating the relationship between the update operation for the operational simulation and the adjoint simulation (e.g., backpropagation), in accordance with an embodiment of the present disclosure. More specifically, FIG. 3B summarizes operational and adjoint simulation relationships that are involved in computing $$\frac{dL}{dz},$$

which include $$\frac{\partial L}{\partial x_i}, \frac{\partial x_{i+1}}{\partial x_i}, \frac{dL}{dx_i}, \text{ and } \frac{\partial x_i}{\partial z}.$$

The update operation 314 updates the field 309, $x_i,$, based on the structural parameters 305, $z,$, to the next field 317, $x_{i+1}$. The gradients 353 are utilized to determine $$\frac{dL}{dx_i}$$

(e.g., the loss gradient) for the backpropagation (e.g., update operation 356 backwards in time) which combined with the field gradients 369 are used, at least in part, to calculate $$\frac{dL}{dz} \cdot \frac{\partial L}{\partial x_i}$$

is the contribution of each field to L (e.g., field gradient). It is noted that this is the partial derivative, and therefore does not take into account the causal relationship of $x_i \to x_{i+1}$. Thus, $$\frac{\partial x_{i+1}}{\partial x_i}$$

is utilized which encompasses the $x_i \to x_{i+1}$ relationship. The loss gradient, $$\frac{dL}{dx_i}$$

is also used to compute $$\frac{dL}{dz}$$

and corresponds to the total derivative of the field with respect to L, where $$\frac{dL}{dx_i} = \frac{\partial L}{\partial x_i} + \frac{dL}{dx_{i+1}}\frac{\partial x_{i+1}}{\partial x_i}.$$

Finally, $$\frac{\partial x_i}{\partial z},$$

which corresponds to the field gradient, is used which is the contribution to $$\frac{dL}{dz}$$

from each time/update step.

In particular, the memory footprint to directly compute $$\frac{\partial L}{\partial x_i} \text{ and } \frac{dL}{dz}$$

is so large that it is intractable to store more than a handful of state Tensors. The state Tensor corresponds to storing the values of all of the FDTD cells (e.g., the field response of the plurality of voxels) for a single simulation time step. It is appreciated that the term "tensor" may refer to tensors in a mathematical sense or as described by the TensorFlow framework developed by Alphabet, Inc. In some embodiments the term "tensor" refers a mathematical tensor which corresponds to a multidimensional array that follows specific transformation laws. However, in most embodiments, the term "tensor" refers to TensorFlow tensors, in which a tensor is described as a generalization of vectors and matrices to potentially higher dimensions (e.g., n-dimensional arrays of base data types), and is not necessarily limited to specific transformation laws. For example, for the general loss function $f$, it may be necessary to store the fields, $x_i$, for all time steps, $i$. This is because, for most choices of $f$, the gradient will be a function of the arguments of $f$. This difficulty is compounded by the fact that the values of $$\frac{\partial L}{\partial x_i}$$

for larger values of $i$, are needed before the values for smaller $i$,, which may prevent the use of schemes that attempt to store only the values $$\frac{\partial L}{\partial x_i},$$

at the immediate time step.

An additional difficulty in performing the backpropagation without a reduced representation is further illustrated when computing $$\frac{dL}{dz},$$

which is given by:

$$\frac{dL}{dz} = \sum_i \frac{dL}{dx_i}\frac{\partial x_i}{\partial z}. \quad (2)$$

For completeness, the full form of the first term in the sum, $$\frac{dL}{dz},$$

is expressed as:

$$\frac{dL}{dx_i} = \frac{\partial L}{\partial x_i} + \frac{dL}{dx_{i+1}}\frac{\partial x_{i+1}}{\partial x_i}.$$

Based on the definition of $\phi$ as described by equation (1), it is noted that $$\frac{\partial x_{i+1}}{\partial x_i} = A(z),$$

which can be substituted in equation (3) to arrive at an adjoint update for backpropagation (e.g., the update operations such as update operation 356), which can be expressed as:

$$\frac{dL}{dx_i} = \frac{\partial L}{\partial x_i} + \frac{dL}{dx_{i+1}}A(z), \text{ or} \quad (4)$$

$$\nabla_{x_i} L = A(z)^T \nabla_{x_{i+1}} L + \frac{\partial L^T}{\partial x_i}. \quad (5)$$

The adjoint update is the backpropagation of the loss metric or gradients from later to earlier time steps and may be referred to as a backwards solve for $$\frac{dL}{dx_i}$$

(e.g., adjoint simulation). The second term in the sum of the structural gradient.

$$\frac{dL}{dz},$$

corresponds to the field gradient and is denoted as:

$$\frac{\partial x_i}{\partial z} = \frac{d\phi(x_{i-1}, b_{i-1}, z)}{dz} = \frac{dA(z)}{dz}x_{i-1} + \left(\frac{dB(z)}{dz}b\right)_{i-1}, \quad (6)$$

for the particular form of φ described by equation (1). Thus, without reduced representation, each term of the sum associated $$\frac{dL}{dz}$$

depends on both $$\frac{dL}{dx_{i_0}} \text{ for } i >= i_0$$

and $x_{i_0}$ for $i < i_0$. Since the dependency chains of these two terms are in opposite directions, it is concluded that computing $$\frac{dL}{dz}$$

in this way (e.g., without reduced representation) also requires the storage of $x_i$ values for all of $i$, which is assumed to be intractable.

To compute $$\frac{\partial L}{\partial x_i}$$

without storing $x_i$ values for all of $i$, the attenuated field values are utilized to recover the target field values during the adjoint simulation. More specifically, the attenuated field values are treated as excitation source and a reverse simulation is performed until reaching the target field value for a particular step in the adjoint simulation. The reverse simulation may subsequently be repeated (or continued) to arrive at the next target field value for the following adjoint simulation step. This process may be repeated successively until the backpropagation (i.e., adjoint simulation) is complete and the structural gradients determined. Once $$\frac{\partial L}{\partial x_i}$$

can be computed with a reduced memory footprint as described above, it can be assumed there is an efficient path to obtaining the adjoint fields $$\frac{dL}{dx_i}.$$

Figure 4:
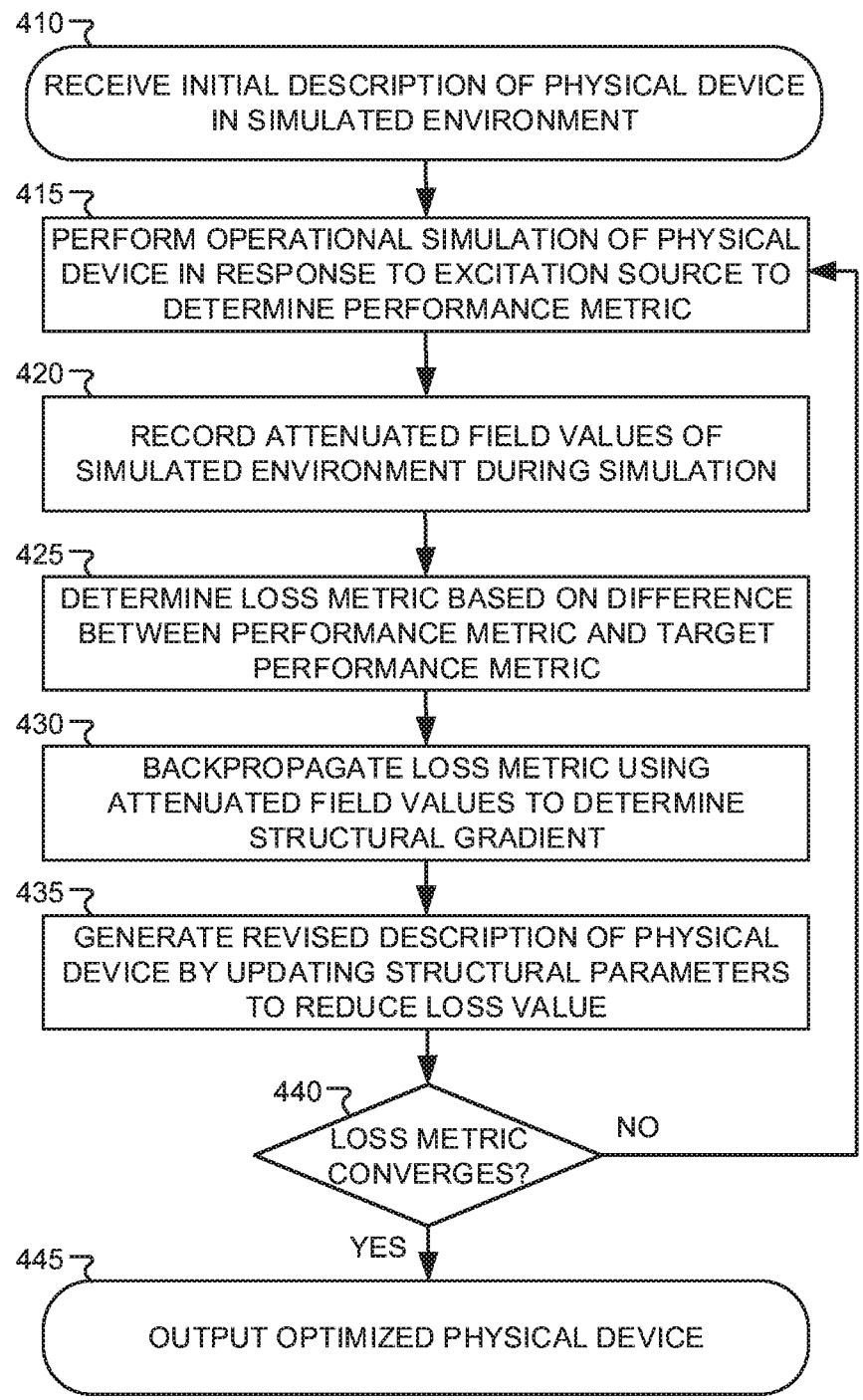
FIG. 4 illustrates a method for optimizing structural parameters of a physical device, in accordance with an embodiment of the present disclosure.

FIG. 4 illustrates a method 400 for optimizing structural parameters of a physical device with reduced memory footprint, in accordance with an embodiment of the present disclosure. The order in which some or all of the process blocks appear in process 400 should not be deemed limiting. Rather, one of ordinary skill in the art having the benefit of the present disclosure will understand that some of the process blocks may be executed in a variety of orders not illustrated, or even in parallel.

Block 410 illustrates receiving (or otherwise obtaining) an initial description of the physical device (e.g., an electromagnetic device) that describes structural parameters of the physical device within a simulated environment. The simulated environment may include a plurality of voxels that collectively describe the structural parameters of physical device. Each of the plurality of voxels is associated with a structural value to describe the structural parameters, a field value to describe the field response (e.g., the electric and magnetic fields in one or more orthogonal directions) to an excitation source, and a source value to describe the excitation source. The simulated environment may also include one or more absorbing boundaries (e.g., one or more absorbing mediums described by the structural parameters of the physical device, one or more perfectly matched layers, and the like). In the same or other embodiments, the absorbing boundaries of the simulated environment includes one or more perfectly matched layers that surround the plurality of voxels and correspond to outer boundaries of the simulated environment (e.g., computational domain). In the same or other embodiments, the absorbing medium included in the absorbing boundary may correspond to a metal material or a non-linear optical material, among other things. In one embodiment, the simulated environment includes a design region that includes a portion of the plurality of voxels which have structural parameters that may be updated, revised, or otherwise changed to optimize the structural parameters of the physical device. In the same or other embodiments, the structural parameters are associated with geometric boundaries and/or material compositions of the physical device based on the material properties (e.g., relative permittivity, index of refraction, etc.) of the simulated environment.

Block 415 shows performing an operational simulation of the physical device operating in response to an excitation source to determine a performance metric of the physical device. More specifically a partial differential equation system is utilized to simulate the field response over a plurality of time steps in which the excitation source is influencing the field values of the field response. The field values for each of the plurality of voxels are incrementally updated over the plurality of time steps to perform the operational simulation. The field values of the plurality of voxels are updated in response to an output of the excitation source and based, at least in part, on the structural parameters of the physical device. Additionally, each update operation at a particular time step may also be based, at least in part, on a previous (e.g., immediately prior) time step. In some embodiments, the field response at an arbitrary one of the plurality of time steps is linearly related with respect to a field values and a source values at an immediately prior time step included in the plurality of time steps.

In one embodiment, the absorbing boundaries of the simulated environment attenuate an output of the excitation source during the simulation (e.g., electromagnetic waves generated in response to the excitation source are absorbed or otherwise reduced upon being incident to the absorbing boundaries). In the same or other embodiments, the output of the excitation source corresponds to electromagnetic radiation that may influence the field values (e.g., electric and/or magnetic field) of the plurality of voxels (e.g., the field response) during the plurality of time steps of the operational simulation. Put in another way, the output of the excitation source corresponds to an influence on the field values of the plurality of voxels due to the excitation source during the operational simulation, which may result in apparent waves (i.e., changes in the field values) propagating or otherwise moving through the simulated environment. The apparent waves or otherwise may be attenuated (e.g., absorbed, reduced, etc.) by the absorbing boundaries of the simulated environment during the operational simulation. In particular, the PMLs strongly absorb the output of the excitation source and may reduce the field values at the PML/non-PML interface (e.g., PML/voxel interface) to a null value.

Block 420 illustrates recording attenuated field values of the simulated environment associated with the attenuation during the simulation (e.g., due to the absorbing boundaries). In one embodiment, the attenuated field values correspond to the field values of a portion of the plurality of voxels proximate to the absorbing boundaries (e.g., the voxels that directly interface or are otherwise adjacent to the absorbing boundaries). In some embodiments, the physical device includes one or more absorbing medium that are described by attenuating voxels included in the plurality of voxels. Thus, the attenuated field values may correspond to the field values associated with the attenuating voxels. In the same or other embodiments, the attenuated field values may be recorded in a compressed representation. For example, the attenuated field values may be subsampled during the simulation such that there is less than a one-to-one correspondence between the attenuated field values and the plurality of time steps of the operational simulation (e.g., attenuated field values sampled every other time step of the plurality of time steps). The unrecorded attenuated field values may then be recovered when needed (e.g., for performing a reverse simulation) by interpolating the attenuated field values to generate at least a one-to-one correspondence between the attenuated field values and the plurality of time steps.

Block 425 shows determining a loss metric based, at least in part, on a difference between a performance metric and a target performance metric of the physical device. The performance metric may correspond to field values of the physical device once the operational simulation has reached steady-state (e.g., at voxels representative of one or more output ports of an optical waveguide). The performance metric, for example, may correspond to an output power and/or mode of the optical waveguide.

Block 430 illustrates backpropagating (e.g., performing an adjoint simulation) the loss metric using the attenuated field values to determine a structural gradient. More specifically, the during the adjoint simulation, the loss metric is treated as an adjoint (or virtual) source and a simulation is performed to backpropagate the loss metric through the simulated environment to determine the structural gradient. The structural gradient corresponds to influence (i.e., sensitivity) in changes of the structural parameters of the physical device on the loss metric. Backwards propagation of error (i.e., backpropagation) may require the field value or response at particular times and points (e.g., temporally and/or spatially) within the simulated environment from the operational simulation. Thus, a reverse simulation may be performed by replaying the attenuated field values (e.g., as an excitation source) from a particular time step to earlier time steps to recover the required field value, response, and/or field gradient from the operational simulation. In some embodiments, when performing the adjoint simulation, a change in the field response is incrementally updated over the plurality of time steps for each of the plurality of voxels from an initial position at the spatial position of the loss metric (i.e., output ports of the optical waveguide). In other words, the adjoint simulation may be referred to as a backwards solve and appear to be a simulation of the loss metric backwards in time.

Block 435 shows generating a revised description of the physical device by updating the structural parameters to reduce the loss metric. In some embodiments, the revised description is generated by utilizing an optimization scheme after a cycle of operational and adjoint simulations via a gradient descent algorithm. Put in another way, iterative cycles of simulating the physical device, backpropagating the loss metric, and updating the structural parameters to reduce the loss metric may be successively performed until the loss metric substantially converges such that the difference between the performance metric and the target performance metric is within a threshold range. In some embodiments, the term "converges" may simply indicate the difference is within the threshold range and/or below some threshold value.

Block 440 illustrates determining whether the loss metric substantially converges such that the difference between the performance metric and the target performance metric is within a threshold range. Iterative cycles of successively performing the operational simulation, performing the backpropagation of the loss metric (e.g., adjoint simulation), and adjusting or otherwise updating the structural parameters (e.g., optimization) to reduce the loss metric are performed repeatedly until the loss metric is reduced to be within the threshold range.

Block 445 illustrates outputting an optimized electromagnetic device in which the structural parameters have been updated to have the difference between the performance metric and the target performance metric within a threshold range.

Figure 5:
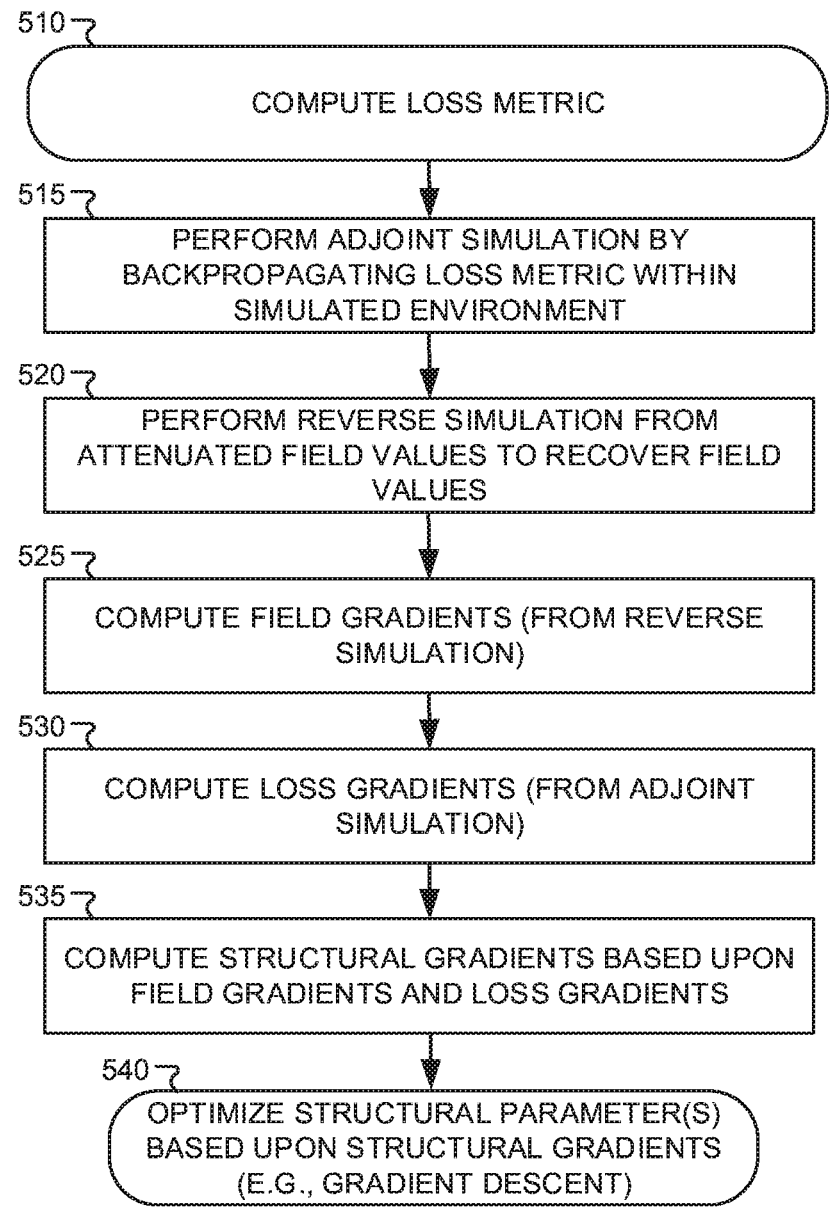
FIG. 5 illustrates a method for determining an influence of structural parameters of a physical device on the loss metric, in accordance with an embodiment of the present disclosure.

FIG. 5 illustrates a method 500 for determining an influence of structural parameters of a physical device on the loss metric, in accordance with an embodiment of the present disclosure. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel.

Block 510 illustrates computing a loss metric (e.g., from a loss function) based, at least in part, on the field response of the operational simulation. More specifically, the loss metric may correspond to a difference between the performance metric of the physical device and the target performance metric.

Block 515 shows performing an adjoint simulation by backpropagating the loss metric within the simulated environment. In other words, the loss metric is treated as an excitation source and a simulation is performed in which the excitation source influences the field values (e.g., loss response) over a plurality of time steps (e.g., referred to as backwards solve, adjoint simulation, and the like).

Block 520 illustrates performing a reverse simulation in which the attenuated field values are replayed over the plurality of time steps in reverse (temporal). The reverse simulation may be used to recover the field response (e.g., field values) from the operational simulation. In some embodiments, the attenuated field values are stored in a compressed form. In one embodiment, the attenuated field values are subsampled. Unrecorded attenuated field values may be recovered by interpolating the recorded field values to substantially recover the field response for the plurality of time steps included in the operational simulation. In the same or other embodiments, the attenuated field values are converted from a frequency domain to a time domain (e.g., via a Fourier transform) to recover the field response at each of the plurality of time steps.

Block 525 shows computing field gradients from the reverse simulation. More specifically, the field gradients are recovered by performing the reverse simulation to recover field values of interest for determining the corresponding field gradient at a particular voxel or voxels. In one embodiment, a field gradient of the plurality of voxels (including a first voxel included in the plurality of voxels) is determined. The field gradient of the first voxel is related to changes of the field value of the first voxel with respect to the structural value of the first voxel over the plurality of time steps. The field gradient at a particular voxel (e.g., the first voxel) may be necessary to determine the loss gradient from the adjoint simulation.

Block 530 illustrates computing loss gradients from the adjoint simulation. In one embodiment, the loss gradient of a first voxel may be determined by back propagating the loss metric through the simulated environment over a plurality of time steps. The loss gradient is related to changes of the loss metric with respect to the field value of the first voxel over the plurality of time steps.

Block 535 shows computing the structural gradients of the simulated environment based on the field gradients and loss gradients. More specifically, the structural gradients may be determined by combining the field gradients and loss gradients of the plurality of voxels and describes the influence of changes in the structural parameters of the physical device on the loss metric. In one embodiment, the loss gradient and field gradient of a first voxel are combined to determine a first structural gradient. The first structural gradient describes a first influence of the changes in the structural value of the first voxel on the loss metric. The influence of changes in the structural parameters on the loss metric includes the first influence.

Block 540 illustrates optimizing the structural parameter(s) based upon structural gradient. In one embodiment, the structural parameters may be successively updated to reduce the loss metric. The specific updates to the structural parameters may be determined via an optimization scheme such as gradient descent.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A computer-implemented method for optimizing structural parameters of a physical device, the method comprising:
   receiving an initial description of the physical device that describes the structural parameters of the physical device within a simulated environment;
   performing a simulation of the physical device in response to an excitation source to determine a performance metric of the physical device, wherein the simulated environment includes one or more absorbing boundaries for attenuation of an output of the excitation source during the simulation;
   recording attenuated field values of the simulated environment associated with the attenuation during the simulation;
   determining a loss metric based on a difference between the performance metric and a target performance metric of the physical device;
   backpropagating the loss metric using the attenuated field values to determine an influence of changes in the structural parameters on the loss metric; and
   generating a revised description of the physical device by updating the structural parameters to reduce the loss metric.

2. The computer-implemented method of claim 1, wherein the physical device is an electromagnetic device, wherein the output of the excitation source corresponds to electromagnetic radiation, and wherein the attenuated field values correspond to at least one of electric field or magnetic field.

3. The computer-implemented method of claim 1, wherein the simulated environment includes a plurality of voxels that collectively describe the structural parameters of the physical device, wherein each of the plurality of voxels is associated with a structural value to describe the structural parameters, a field value to describe a field response to the excitation source, and a source value to describe the excitation source, and wherein the field response includes the attenuated field values.

4. The computer-implemented method of claim 3, wherein the attenuated field values correspond to the field value of a portion of the plurality of voxels proximate to the absorbing boundaries.

5. The computer-implemented method of claim 4, wherein the output of the excitation source corresponds to an influence on the field values of the plurality of voxels due to the excitation source during the simulation.

6. The computer-implemented method of claim 3, wherein the simulation environment includes one or more perfectly matched layers ("PMLs") that surround the plurality of voxels and correspond to outer boundaries of the simulated environment, and wherein the PMLs are included in the absorbing boundaries.

7. The computer-implemented method of claim 3, wherein the physical device includes at least one absorbing medium that attenuates the output of the excitation source during the simulation, and wherein the absorbing medium is included in the absorbing boundaries.

8. The computer-implemented method of claim 7, wherein the absorbing medium is a non-linear optical material.

9. The computer-implemented method of claim 7, wherein the absorbing medium and the one or more absorbing boundaries are not information preserving when performing the operational simulation, and wherein the attenuation corresponds to the information that is lost during the simulation.

10. The computer-implemented method of claim 3, further comprising:
incrementally updating the field value over a plurality of time steps for each of the plurality of voxels to perform the simulation, wherein the attenuated field values correspond to the field value of one or more of the plurality of voxels proximate to the absorbing boundaries, and wherein the field value is updated in response to the output of the excitation source and based on the structural parameters of the physical device.

11. The computer-implemented method of claim 10, further comprising:
performing a reverse simulation in which the attenuated field values are replayed over the plurality of time steps in reverse order to determine a field gradient of a first voxel included in the plurality of voxels, wherein the field gradient is related to changes of the field value of the first voxel with respect to the structural value of the first voxel over the plurality of time steps.

12. The computer-implemented method of claim 11, wherein backpropagating the loss metric includes:
determining a loss gradient of the first voxel, wherein the loss gradient is related to changes of the loss metric with respect to the field value of the first voxel over the plurality of time steps.

13. The computer-implemented method of claim 12, further comprising:
combining the loss gradient and the field gradient to determine a structural gradient of the first voxel, wherein the structural gradient describes a first influence of changes in the structural value of the first voxel on the loss metric, and wherein the influence of changes in the structural parameters on the loss metric includes the first influence.

14. The computer-implemented method of claim 1, wherein the attenuated field values are recorded in a compressed representation.

15. The computer-implemented method of claim 14, wherein the simulation occurs over a plurality of time steps, and wherein the attenuated field values are subsampled at less than a one-to-one correspondence with the plurality of time steps.

16. The computer-implemented method of claim 15, further comprising:
interpolating the attenuated field values that have been recorded to generate at least a one-to-one correspondence between the attenuated field values and the plurality of time steps.

17. The computer-implemented method of claim 1, further comprising:
iteratively performing cycles of simulating the physical device, backpropagating the loss metric, and updating the structural parameters to reduce the loss metric until the loss metric converges such that the difference between the performance metric and the target performance metric is within a threshold range.

18. At least one non-transitory machine-accessible storage medium that provides instructions that, when executed by a machine, will cause the machine to perform operations comprising:
receiving an initial description of a physical device that describes structural parameters of the physical device within a simulated environment;
performing a simulation of the physical device in response to an excitation source to determine a performance metric of the physical device, wherein the simulated environment includes one or more absorbing boundaries to attenuate an output of the excitation source during the simulation;
recording attenuated field values of the simulated environment associated with the attenuation during the simulation;
determining a loss metric based on a difference between the performance metric and a target performance metric of the physical device;
backpropagating the loss metric using the attenuated field values to determine an influence of changes in the structural parameters on the loss metric; and
generating a revised description of the physical device by updating the structural parameters to reduce the loss metric.

19. The at least one non-transitory storage medium of claim 18, wherein the simulated environment includes a plurality of voxels that collectively describe the structural parameters of the physical device, wherein each of the plurality of voxels is associated with a structural value to describe the structural parameters, a field value to describe a field response to the excitation source, and a source value to describe the output of the excitation source, and wherein the field response includes the attenuated field values.

20. The at least one non-transitory storage medium of claim 19, wherein the simulation environment includes one or more perfectly matched layers ("PMLs") that surround the plurality of voxels and correspond to outer boundaries of the simulated environment, and wherein the PMLs are included in the absorbing boundaries.

21. The at least one non-transitory storage medium of claim 18, providing additional instructions that, when executed by the machine, will cause the machine to perform further operations, comprising:
incrementally updating the field value over a plurality of time steps for each of the plurality of voxels to perform the simulation, wherein the attenuated field values correspond to the field value of one or more of the plurality of voxels proximate to the absorbing boundaries, and wherein the field value is updated in response to the output of the excitation source and based on the structural parameters of the physical device.

22. The at least one non-transitory storage medium of claim 21, providing additional instructions that, when executed by the machine, will cause the machine to perform further operations, comprising:
performing a reverse simulation in which the attenuated field values are replayed over the plurality of time steps in reverse order to determine a field gradient of a first voxel included in the plurality of voxels, wherein the field gradient is related to changes of the field value of the first voxel with respect to the structural value of the first voxel over the plurality of time steps.

23. The at least one non-transitory storage medium of claim 18, wherein the attenuated field values are recorded in a compressed representation.

24. The at least one non-transitory storage medium of claim 23, providing additional instructions that, when executed by the machine, will cause the machine to perform further operations, comprising:
- subsampling the attenuated field values at less than a one-to-one correspondence with a plurality of time steps to record the attenuated field values, wherein the simulation occurs over the plurality of time steps; and
- interpolating the attenuated field values that have been recorded to generate at least a one-to-one correspondence between the attenuated field values and the plurality of time steps.

\* \* \* \* \*